(12) United States Patent
Eldershaw et al.

(10) Patent No.: US 8,960,120 B2
(45) Date of Patent: Feb. 24, 2015

(54) MICRO-EXTRUSION PRINTHEAD WITH NOZZLE VALVES

(75) Inventors: Craig Eldershaw, Belmont, CA (US); David G. Duff, Portola Valley, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1467 days.

(21) Appl. No.: 12/331,355

(22) Filed: Dec. 9, 2008

(65) Prior Publication Data

US 2010/0143581 A1    Jun. 10, 2010

(51) Int. Cl.
  *B05D 5/12* (2006.01)
  *B67D 3/00* (2006.01)
  *B41J 2/005* (2006.01)
  *H01L 31/0224* (2006.01)

(52) U.S. Cl.
  CPC ......... *B41J 2/005* (2013.01); *H01L 31/022425* (2013.01); *Y02E 10/50* (2013.01)
  USPC .......................... 118/255; 425/113; 425/133.5

(58) Field of Classification Search
  CPC ... B41J 2/005; H01L 31/022425; Y02E 10/50
  USPC ................ 427/98.4; 118/255; 425/133.5, 113
  See application file for complete search history.

(56) References Cited

U.S. PATENT DOCUMENTS 2,031,387 A    2/1936   Schwarz
2,326,803 A    8/1943   Samiran (Continued)

FOREIGN PATENT DOCUMENTS

CN    2606309 Y    3/2004
CN    1854637 A    11/2006

(Continued)

OTHER PUBLICATIONS

Murphy, Jr. "Home photovoltaic systems for physicists," *Physics Today*, Jul. 2008, pp. 42-47.
Knight et al. "Hydrodynamic Focusing on a Silicon Chip: Mixing Nanoliters in Microseconds", Physical Review Letters, vol. 80, No. 17, Apr. 27, 1998, pp. 3863-3866.
Raabe et al. "High Aspect Ratio Screen Printed Fingers", 20th European Solar Energy Conference and Exhibition, Barcelona, Spain, Jun. 6-10, 2005, 4 pgs.

(Continued)

*Primary Examiner* — Philip Tucker
*Assistant Examiner* — Vicki Wu
(74) *Attorney, Agent, or Firm* — Bever, Hoffman & Harms, LLP; Patrick T. Bever

(57) ABSTRACT

A solar cell extrusion printing system includes a printhead assembly having one or more elongated valve structures that are adjustably disposed adjacent to the outlet orifices of selected nozzle channels, and a valve control device for controlling the position of the valve structures to facilitate controllable ink flow through selected nozzle channels of the printhead assembly during the gridline printing process. The printhead assembly defines an elongated opening (e.g., a slot or hole) that that intersects (i.e., passes through) each of the selected nozzle channels, and an elongated member is movably disposed in the slot and is selectively movable between a first (opened) position, in which the valve structure extrusion material is passed by the valve structure through the nozzle channel and out of the printhead, and a closed position, in which the extrusion material is blocked by the valve structure and prevented from passing through the nozzle channel.

14 Claims, 10 Drawing Sheets

(56) References Cited

U.S. PATENT DOCUMENTS

| | | |
|---|---|---|
| 2,761,791 A | 9/1956 | Russell |
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 3,973,994 A | 8/1976 | Redfield |
| 3,988,166 A | 10/1976 | Beam |
| 4,018,367 A | 4/1977 | Morine et al. |
| 4,021,267 A | 5/1977 | Dettling |
| 4,045,246 A | 8/1977 | Mlavsky et al. |
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,119,058 A | 10/1978 | Schmermund |
| 4,131,485 A | 12/1978 | Meinel et al. |
| 4,141,231 A | 2/1979 | Kudlich |
| 4,148,301 A | 4/1979 | Cluff |
| 4,153,476 A | 5/1979 | Shelpuk |
| 4,177,083 A | 12/1979 | Kennedy |
| 4,221,468 A | 9/1980 | Macken |
| 4,224,081 A | 9/1980 | Kawamura et al. |
| 4,254,894 A | 3/1981 | Fetters |
| 4,301,322 A | 11/1981 | Amick |
| 4,331,703 A | 5/1982 | Lindmayer |
| 4,337,758 A | 7/1982 | Meinel et al. |
| 4,355,196 A | 10/1982 | Chai |
| 4,418,640 A * | 12/1983 | Dettelbach et al. ............ 118/411 |
| 4,420,510 A * | 12/1983 | Kunkel et al. .............. 427/208.2 |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,540,843 A | 9/1985 | Gochermann et al. |
| 4,602,120 A | 7/1986 | Wakefield et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,938,994 A | 7/1990 | Choinski |
| 4,947,825 A | 8/1990 | Moriarty |
| 4,952,026 A | 8/1990 | Bellman et al. |
| 4,985,715 A | 1/1991 | Cyphert et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,120,484 A | 6/1992 | Cloeren |
| 5,151,377 A | 9/1992 | Hanoka et al. |
| 5,167,724 A | 12/1992 | Chiang |
| 5,180,441 A | 1/1993 | Cornwall et al. |
| 5,188,789 A | 2/1993 | Nishiura |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,605,720 A | 2/1997 | Allen et al. |
| 5,665,175 A | 9/1997 | Safir |
| 5,679,379 A | 10/1997 | Fabbricante et al. |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,130,465 A | 10/2000 | Cole |
| 6,140,570 A | 10/2000 | Kariya |
| 6,164,633 A | 12/2000 | Mulligan et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,375,311 B1 * | 4/2002 | Kuramoto ........................ 347/54 |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,479,395 B1 | 11/2002 | Smith et al. |
| 6,527,964 B1 | 3/2003 | Smith et al. |
| 6,529,220 B1 | 3/2003 | Matsumoto |
| 6,531,653 B1 | 3/2003 | Glenn et al. |
| 6,555,739 B2 | 4/2003 | Kawam |
| 6,558,146 B1 | 5/2003 | Shah et al. |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 6,955,348 B2 * | 10/2005 | Koga .............................. 271/97 |
| 7,045,794 B1 | 5/2006 | Spallas et al. |
| 7,101,592 B2 | 9/2006 | Gueggi et al. |
| 7,152,985 B2 | 12/2006 | Benitez et al. |
| 7,160,522 B2 | 1/2007 | Minano Dominguez et al. |
| 7,160,574 B1 | 1/2007 | Gillanders et al. |
| 7,181,378 B2 | 2/2007 | Benitez et al. |
| 7,388,147 B2 | 6/2008 | Mulligan et al. |
| 7,394,016 B2 | 7/2008 | Gronet |
| 7,765,949 B2 | 8/2010 | Fork et al. |
| 7,780,812 B2 | 8/2010 | Fork et al. |
| 2001/0008230 A1 | 7/2001 | Keicher et al. |
| 2001/0053420 A1 | 12/2001 | Donges et al. |
| 2002/0056473 A1 | 5/2002 | Chandra et al. |
| 2002/0060208 A1 | 5/2002 | Liu et al. |
| 2002/0083895 A1 | 7/2002 | Nakamura et al. |
| 2002/0148497 A1 | 10/2002 | Sasaoka et al. |
| 2002/0149107 A1 | 10/2002 | Chang et al. |

(56) References Cited

U.S. PATENT DOCUMENTS

| | | |
|---|---|---|
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0200520 A1 | 10/2004 | Mulligan et al. |
| 2004/0211460 A1 | 10/2004 | Simburger et al. |
| 2004/0259382 A1 | 12/2004 | Nishimura et al. |
| 2004/0265407 A1 | 12/2004 | Prugh et al. |
| 2005/0000566 A1 | 1/2005 | Posthuma et al. |
| 2005/0029236 A1 | 2/2005 | Gambino et al. |
| 2005/0034751 A1 | 2/2005 | Gross et al. |
| 2005/0046977 A1 | 3/2005 | Shifman |
| 2005/0067729 A1 | 3/2005 | Laver et al. |
| 2005/0081908 A1 | 4/2005 | Stewart |
| 2005/0133084 A1 | 6/2005 | Joge et al. |
| 2005/0194037 A1 | 9/2005 | Asai |
| 2005/0221613 A1 | 10/2005 | Ozaki et al. |
| 2005/0253308 A1 | 11/2005 | Sherwood |
| 2006/0207650 A1 | 9/2006 | Winston et al. |
| 2006/0231133 A1 | 10/2006 | Fork et al. |
| 2006/0251796 A1 | 11/2006 | Fellingham |
| 2006/0266235 A1 | 11/2006 | Sandhu et al. |
| 2007/0108229 A1 | 5/2007 | Fork et al. |
| 2007/0110836 A1 | 5/2007 | Fork et al. |
| 2008/0029152 A1 | 2/2008 | Milshtein et al. |
| 2008/0047605 A1 | 2/2008 | Benitez et al. |
| 2008/0138456 A1 | 6/2008 | Fork et al. |
| 2009/0101190 A1 | 4/2009 | Salami et al. |
| 2010/0116199 A1 | 5/2010 | Fork et al. |
| 2010/0117254 A1 | 5/2010 | Fork et al. |

FOREIGN PATENT DOCUMENTS

| | | |
|---|---|---|
| DE | 197 35 281 A1 | 2/1999 |
| DE | 102006011580 B3 * | 10/2007 |
| EP | 0 257 157 A | 3/1988 |
| EP | 0 851 511 A | 7/1998 |
| EP | 1 145 797 A | 10/2001 |
| EP | 1 351 318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 10/1985 |
| JP | 02 187291 A | 7/1990 |
| JP | 05-031786 A | 2/1993 |
| JP | 2002-111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A1 | 9/2006 |
| WO | WO 2007/104028 | 9/2007 |

OTHER PUBLICATIONS

"Annual Review of Numerical Fluid Mechanics and Heat Transfer", vol. 1, Ed. T. C. Chawla, "Chapter Five, Buckling Flows: A New Frontier in Fluid Mechanics", A. Bejan, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "Buried Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells", Oct. 1999, IEEE Transactions on Electron Devices, vol. 46, No. 10, pp. 2055-2061.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of $CuInSe_2$ Thin Films-Comparison of Femtosecond and Picosecond Laser Ablation", Applied Surface Science, vol. 247, No. 1-4, Jul. 15, 2005, pp. 447-452.

U.S. Appl. No. 11/282,882, filed Nov. 17, 2005, Fork et al.
U.S. Appl. No. 11/282,829, filed Nov. 17, 2005, Fork et al.
U.S. Appl. No. 11/336,714, filed Jan. 20, 2006, Fork et al.

Alvarez et al. "RXI Concentrator for 1000X Photovoltaic Energy Conversion," Proc. SPIE, vol. 3781, 30 (1999), 9 pages.

Benitez et al. "High-Concentration Mirror-Based Kohler Integrating System for Tandem Solar Cells", WCPEC2006, 4 pages.

Bett et al. "FLATCON™ and FLASHCON™ Concepts for High Concentration PV", Presented at the 19$^{th}$ European Photovoltaic Solar Energy Conf., Jun. 7-11, 2004, Paris, 4 pages.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "$Bi_2O_3$—$Wo_3$ compounds for photocatalytic applications by solid state and viscous processing", Title from a conference scheduled for Oct. 6-7, 2004 in Munich, 8 pages.

Gordon et al. "Optical performance at the thermodynamic limit with tailored imaging designs", Applied Optics, *in press*, Dec. 2004, 16 pages.

Kenis et al. "Fabrication inside Microchannels Using Fluid Flow", Accounts of Chemical Research, vol. 33, No. 12, 2000, pp. 841-847.

Kerschaver et al. "Back-contact Solar Cells: A Review," Progress in Photovoltaics: Research and Applications, 2006, vol. 14, pp. 107-123.

Kränzl et al. "Bifacial Solar Cells on Multi-Crystalline Silicon", 15$^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Mulligan et al. "A Flat-Plate Concentrator: Micro-Concentrator Design Overview", 2000 IEEE, pp. 1495-1497.

Mulligan et al. "Development of Chip-Size Silicon Solar Cells," IEEE Photovoltaic Specialists Conference, 2000, pp. 158-163.

Neuhaus et al. "Industrial Silicon Wafer Solar Cells," Advances in OptoElectronics, vol. 2007, 2007, 15 pages.

(56) References Cited

OTHER PUBLICATIONS

Nguyen, Luu "Wafer Level Packaging for Analog/Mixed Signal Applications", MEPTEC Int. Wafer Level Packaging Conference, Aug. 22, 2002, 41 pages.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Taguchi et al. An Approach for the Higher Efficiency in the HIT Cells, IEEE, pp. 866-871, 2005.

Terao et al. "A Mirror-Less Design for Micro-Concentrator Modules", Conference Record of the 28$^{th}$ IEEE Photovoltaic Specialists Conference (2000) pp. 1416-1419.

Terao, Akira "MicroDish: A Novel Reflective Optic for Flat-Plate Micro-Concentrator", SPIE's 49$^{th}$ Annual Meeting, Aug. 2-6, 2004, Denver, Colorado, USA, 9 pages.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepagel.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Sparber et al. "Comparison of texturing methods for monocrystalline silicon solar cells using KOH and $Na_2CO_3$," 3$^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," 31$^{st}$ IEEE Photovoltaic Specialists Conf., Florida, 2005, pp. 1324-1327.

Fukui et al. "17.7% efficiency large area multicrystalline silicon solar cell using screen-printed metallization technique," 31$^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Sobhan, C. B. et al. "A review and comparative study of the investigations on micro heat pipes", Int. J. Energy Res., 2007, vol. 31, pp. 664-688.

Duncan, A. B. et al. "Charge Optimization for a Triangular-Shaped Etched Micro Heat Pipe", J. Thermophysics, 1994, vol. 9, No. 2, Technical Notes, pp. 365-368.

Le Berre et al. "Fabrication and experimental investigation of silicon micro heat pipes for cooling electronics", J. Micromech. Microeng. 13 (2003) 436-441.

Wang, Y. X. et al. "Investigation of the Temperature Distribution on Radiator Fins with Micro Heat Pipes", J. Thermophysics and Heat Transfer, vol. 15, No. 1, Jan.-Mar. 2001, pp. 42-49.

Joshi et al. "Micro and Meso Scale Compact Heat Exchangers in Electronics Thermal Management—A Review", Proc. of 5th Int. Conf. on Enhanced, Compact and Ultra-Compact Heat Exchangers: Science, Engineering and Technology, Eds. R. K. Shah et al., Engineering Conferences International, Hoboken, NJ, USA, Sep. 2005, pp. 162-179.

Sobhan, C. B. et al. "Modeling of the Flow and Heat Transfer in Micro Heat Pipes", ASME 2nd International Conference on Microchannels and Minichannels, 2004, pp. 883-890.

\* cited by examiner

MICRO-EXTRUSION PRINTHEAD WITH NOZZLE VALVES

FIELD OF THE INVENTION

The present invention is related to the production of wafer-based electronic devices, and more particularly to the production of frontside metallization on H-pattern solar cells using micro-extrusion techniques.

BACKGROUND

FIG. 7 is a simplified diagram showing an exemplary conventional H-pattern contact solar cell 40 that converts sunlight into electricity by the inner photoelectric effect. Solar cell 40 is formed on a semiconductor (e.g., monocrystalline silicon) substrate 41 that is processed using known techniques to include an n-type doped upper region 41A and a p-type doped lower region 41B such that a pn-junction is formed near the center of substrate 41. Disposed on a frontside surface 42 of semiconductor substrate 41 are a series of parallel metal gridlines (fingers) 44 (shown in end view) that are electrically connected to n-type region 41A. A substantially solid conductive layer 46 is formed on a backside surface 43 of substrate 41, and is electrically connected to p-type region 41B. An antireflection coating 47 is typically formed over upper surface 42 of substrate 41. Solar cell 40 generates electricity when a photon from sunlight beams L1 pass through upper surface 42 into substrate 41 and hit a semiconductor material atom with an energy greater than the semiconductor band gap, which excites an electron ("−") in the valence band to the conduction band, allowing the electron and an associated hole ("+") to flow within substrate 41. The pn-junction separating n-type region 41A and p-type region 41B serves to prevent recombination of the excited electrons with the holes, thereby generating a potential difference that can be applied to a load by way of gridlines 44 and conductive layer 46, as indicated in FIG. 7.

FIGS. 8(A) and 8(B) are perspective views showing the frontside and backside contact patterns, respectively, of solar cell 40 in additional detail. As shown in FIG. 8(A), the frontside contact pattern solar cell 40 consists of a rectilinear array of parallel narrow gridlines 44 and one or more wider collection lines (bus bars) 45 that extend perpendicular to gridlines 44, both disposed on upper surface 42. Gridlines 44 collect electrons (current) from substrate 41 as described above, and bus bars 45 which gather current from gridlines 44. In a photovoltaic module, bus bars 45 become the points to which metal ribbon (not shown) is attached, typically by soldering, with the ribbon being used to electrically connect one cell to another. As shown in FIG. 8(B), the backside contact pattern solar cell 40 consists of a substantially continuous back surface field (BSF) metallization layer 46 and three spaced apart solder pad metallization structures 48 that are disposed on backside surface 43. Similar to bus bars 45 formed on upper surface 42, solder pad metallization structures 48 serve as points to which metal ribbon (not shown) is soldered, with the ribbon being used to electrically connect one cell to another.

Conventional methods for producing solar cell 40 include screen-printing and micro-extrusion. Screen-printing techniques were first used in the large scale production of solar cells, but has a drawback in that it requires physical contact with the semiconductor substrate, resulting in relatively low production yields. Micro-extrusion methods were developed more recently in order to meet the demand for low cost large-area semiconductors, and include extruding a dopant bearing material (dopant ink) onto the surface of a semiconductor substrate using a micro-extrusion printhead.

FIG. 9 is simplified diagram depicting the currently used micro-extrusion method for printing gridlines 44 onto frontside surface 42 of substrate 41 in the production of solar cell 40 (shown in FIGS. 8(A)). Substrate 41 is positioned below and moved relative to printhead 60 (e.g., in the Y-axis direction indicated by the arrow in FIG. 9) while gridline material is extruded from several nozzle outlets 69, causing the extruded gridline material to form parallel gridline structures (traces) on substrate 41. The extrusion (gridline printing) process is started when nozzle outlets 69 are positioned a predetermined distance from front edge 41F of substrate 41 such that leading edges of gridlines 44 are separated from front edge 41F by a space S. This spacing is provided in order to prevent the deposition of gridline material too close to front edge 41F, which can result in a short-circuit between gridlines 44 and conductors (not shown) that are formed on the backside surface of substrate 41. Similarly, the gridline printing process is terminated to provide a space between the lagging ends of gridlines 44 and back edge 41B of substrate 41. In comparison to screen printing techniques, the extrusion of dopant material onto substrate 41 provides superior control of the feature resolution of the doped regions, and facilitates deposition without contacting substrate 41, thereby avoiding wafer breakage (i.e., increasing production yields). Such fabrication techniques are disclosed, for example, in U.S. Patent Application No. 20080138456, which is incorporated herein by reference in its entirety.

As indicated at the lower right portion of FIG. 9, a problem with the current solar cell extrusion printing technique is that it is difficult to generate clean starts and stops to the printed traces. For example, as indicated by the rightmost traces 44A shown in FIG. 9, sputtering of the extruded material at the start of the gridline printing process can produce broken (segmented) gridlines, preventing electrical conductivity along the entire length of gridlines 44A. Similar segmented line sections are produced at the end of gridlines 44 when the gridline printing process is terminated. The broken traces occur because the flow of the conductive ink and/or support material is uneven when pumping commences (and when it stops). It is possible to avoid this segmentation of gridlines 44 by starting the pumping (and so also the printing) before substrate 41 is located below printhead 60, thereby allowing the gridline material flow stabilize before the extruded material deposits on substrate 41, and by stopping the pumping after substrate 41 has completely passed under printhead 60. However, this solution produces the problem of printing conductive ink right up to the wafer's edge, which can result in an electrical short between the upper and lower surfaces of the substrate, rendering the solar cell useless.

As indicated in FIGS. 10 and 11, another problem faced by current solar cell extrusion printing equipment is that many solar cells are formed on substrates (wafers) that are non-rectangular. That is, even if the current mechanism was improved to give clean start/stops, the current mechanism would be incapable of individually controlling the nozzles to facilitate printing on non-rectangular regions in which at least some of the gridlines are shorter than other gridlines, such as encountered when printing upon circular wafers, such as that shown in FIG. 10, or octagonal substrates, such as that shown in FIG. 11. These non-rectangular wafers require individual control over each nozzle in order to produce the desired gap (spacing S) for both the longer centrally-located gridlines and the shorter gridlines located at the edges of the substrate.

FIG. 12 illustrates yet another problem associated with current solar cell extrusion printing equipment in that, if substrate 41 is misaligned in the cross-process direction (i.e., shifted from its nominal position in the X direction) relative to printhead 60, then the resulting gridlines extruded by nozzle outlets 69 are incorrectly spaced with reference to side edges 41S1 and 41S2 of substrate 41. For example, such a shift produces a relatively large gap G1 between leftmost gridline 44B1 and side edge 41S1, and a small gap G2 between rightmost gridline 44B2 and side edge 41S2. Current solar cell extrusion printing equipment includes no mechanism for correcting such misalignment of substrate 41 and printhead 60 in the cross-process direction.

What is needed is solar cell extrusion printing equipment and an associated method for forming gridlines on a solar cell that avoids the problems mentioned above in association with the conventional gridline printing process.

SUMMARY OF THE INVENTION

The present invention is directed to a solar cell extrusion printing system including a printhead assembly and a material feed system for pumping one or more extrusion materials (inks) into the printhead assembly during, for example, a gridline printing process associated with the production of solar cells. To address the problems associated with conventional systems, one or more valve structures are provided adjacent to the nozzle outlets of selected nozzle channels, and the printing system includes a control device for controlling the valve structures to facilitate controllable ink flow from selected nozzle channels of the printhead assembly onto the solar cell substrate during the gridline printing process. By controlling the flow of ink from selected nozzle channels onto the substrate, the present invention facilitates parallel or sequential control the flow of ink from selected individual nozzle channels (or groups of nozzle channels) onto the substrate. In one embodiment, this selective control of ink flow facilitates the printing of gridlines on non-rectangular substrates without violating edge spacing requirements. In another embodiment, this selective control is utilized to selectively block nozzle channels located adjacent to the side edges of the printhead assembly, providing an effective mechanism for automatically correcting misalignment of the solar panel substrate in the cross-process direction.

In accordance with an embodiment of the present invention, the valve structures are disposed inside the micro-extrusion printhead assembly (e.g., between inlet and outlet portions of each nozzle channel). In this way, the adjustable valve structures are disposed between a high pressure source (e.g., a reservoir inside the printhead) and the outlet orifices of selected nozzle channels, and is adjustable by way of a control device between positions that open/close selected nozzle channels. When biased into the open position relative to a selected nozzle channel, the valve structure allows the supplied ink to flow from the high pressure source through the selected nozzle channel and out of the printhead assembly to form a corresponding trace on a target substrate. When biased into the closed position, the extrusion material is blocked by the valve structure to prevent the printing process from the associated nozzle channel. By providing the valve structures inside the printhead and adjacent to the nozzle outlet orifices, the present invention shortens the distance between a high pressure material source and the solar panel substrate at the start and end of each gridline printing process, thereby facilitating a reduction in the occurrence of segmented gridlines associated with conventional printheads.

In accordance with an embodiment of the present invention, the printhead assembly defines an elongated opening (e.g., a slot or hole) that that intersects (i.e., passes through) each of the selected nozzle channels, and the elongated valve structure includes an elongated member that is movably disposed in the slot and is selectively movable to open/close selected nozzle channels. In one specific embodiment, a rectangular slot is defined in the printhead, and a tight fitting rectangular strip is slidably disposed in the slot. When slid between first and second positions in the slot, the rectangular strip alternately prevents and allows flow of extrusion material through at least some of the nozzle channels. In another specific embodiment, the rectangular strip is solid such that it blocks a large number of nozzles when fully inserted into the printhead assembly, and opens these nozzles only when the strip is removed from the printhead assembly. In yet another specific embodiment, the elongated member defines multiple openings that simultaneously open multiple nozzle channels when aligned with the nozzle channels within the printhead. In another specific embodiment, the elongated member is an elongated rod that fits into a cylindrical opening or bore extending through the nozzle channels, and flow is controlled by sliding or rotating the rod, for example, to align openings in the rod with the nozzle channels.

In accordance with yet another embodiment, the valve structures of the present invention are utilized in a co-extrusion printhead to selectively block the flow of a conductive ink. The valving is not used to control the flow of a non-conductive ink, which is allowed to pass through the printhead assembly and onto the solar panel substrate, because the non-conductive ink does not produce electrical shorts.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improvement in micro-extrusion systems, and more particularly to micro-extrusion systems used in the production of solar cells. The following description is presented to enable one of ordinary skill in the art to make and use the invention as provided in the context of a particular application and its requirements. As used herein, directional terms such as "upper", "top", "lower", "bottom", "front", "rear", and "lateral" are intended to provide relative positions for purposes of description, and are not intended to designate an absolute frame of reference. Various modifications to the preferred embodiment will be apparent to those with skill in the art, and the general principles defined herein may be applied to applications other than the production of solar cells. Therefore, the present invention is not intended to be limited to the particular embodiments shown and described, but is to be accorded the widest scope consistent with the principles and novel features herein disclosed.

Figure 1:
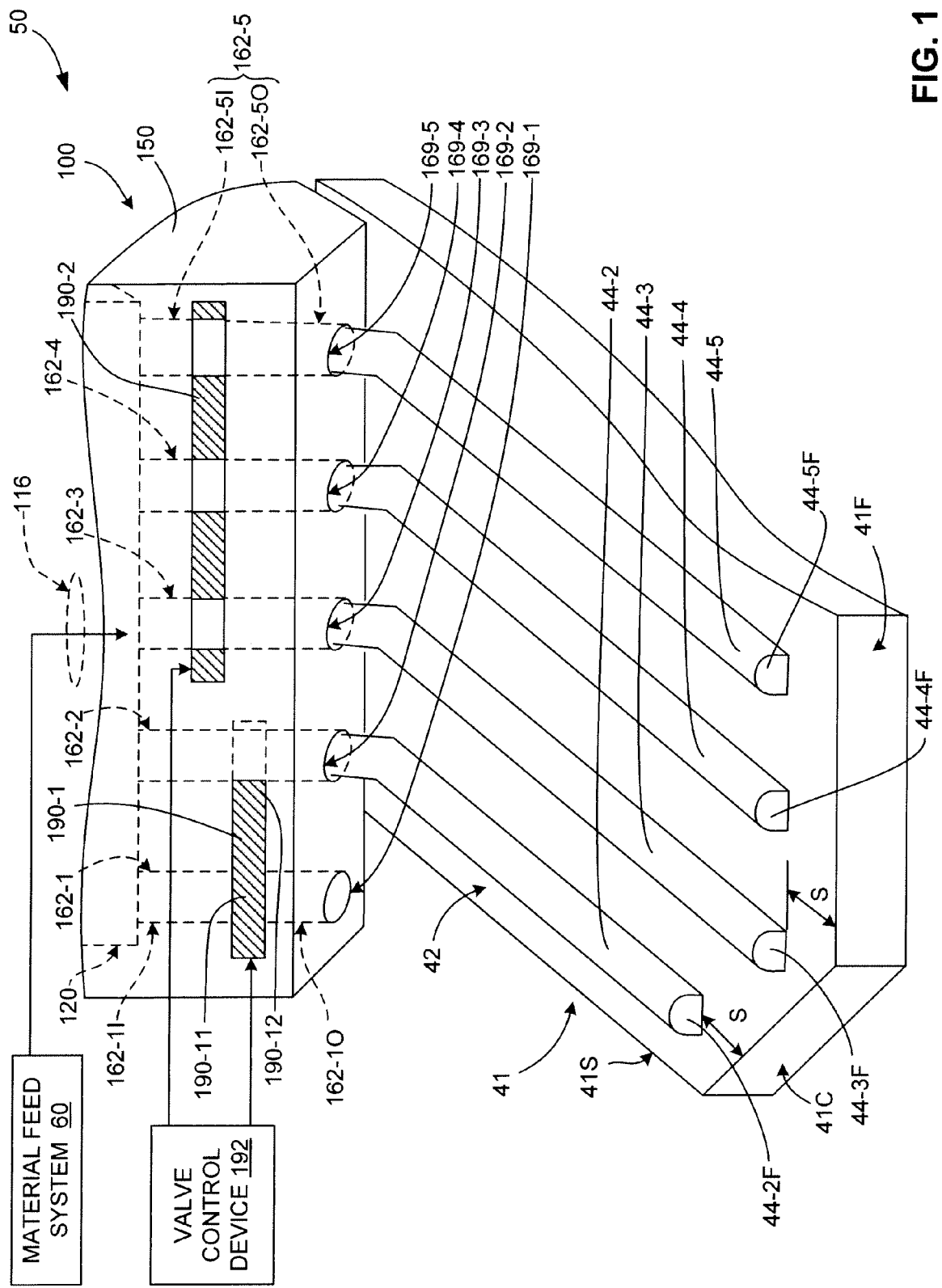
FIG. 1 is a simplified perspective view showing a micro-extrusion system for producing solar cells in accordance with a generalized embodiment of the present invention.
Figure 10:
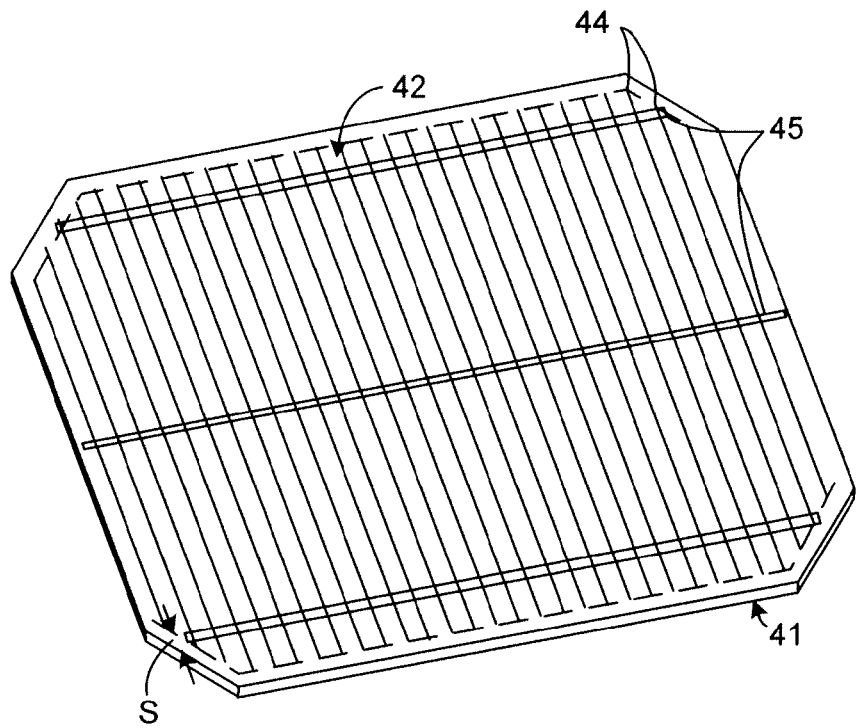
FIG. 10 is a top plan view showing a conventional H-pattern solar cell formed on a non-rectangular substrate.

FIG. 1 is a perspective view showing a portion of a micro-extrusion system 50 for printing (depositing) extruded materials (inks) onto a solar cell (e.g., doped monocrystalline silicon) substrate 41 according to a generalized embodiment of the present invention. Micro-extrusion system 50 generally includes a printhead assembly 100 that is positioned over substrate 41 during the printing process, a material feed system 60 for pumping the ink into printhead assembly 100, and a positioning mechanism (not shown) for moving printhead assembly 100 over substrate 41 (or substrate 41 under printhead assembly 100) during the printing process. In the embodiment illustrated in FIG. 1, substrate 41 includes a chamfered edge 41C that extends between a front edge 41F and a side edge 41S in a manner similar to that described above with reference to FIG. 10. As set forth below, the generalized embodiment described below with reference to FIG. 1 and the various specific embodiments described below with reference to FIGS. 2 to 6 are beneficially used to produce solar panels on both rectangular and non-rectangular substrates. Micro-extrusion systems that may be modified as described herein for producing solar panels in accordance with the present invention are described in additional detail, for example, in co-owned and co-pending U.S. patent application Ser. No. 12/267,069, entitled "DIRECTIONAL EXTRUDED BEAD CONTROL", filed Nov. 7, 2008, which is incorporated herein by reference in its entirety.

Referring to the upper portion of FIG. 1, printhead assembly 100 is a block-like structure (partially shown) including an inlet port 116 for receiving the ink from material feed system 60, a reservoir 120 for storing ink at a substantially uniform predetermined pressure, and a nozzle structure 150 defining a row of parallel nozzle channels 162-1 to 162-5 for passing the ink from reservoir 120 to a series of nozzle outlets (orifices) 169-1 to 169-5. Each nozzle channel (e.g., nozzle channel 162-5) includes an inlet (upper) portion (e.g., inlet region 162-5I) that communicates with reservoir 120, and an outlet (lower) portion (e.g., outlet region 162-5O) that communicates with an associated nozzle outlet (e.g., nozzle outlet 169-5). With this arrangement, the ink disposed in the inlet regions of each nozzle channel 162-1 to 162-5 (e.g., inlet regions 161-1I and 162-5I) is maintained at a predetermined pressure suitable for extrusion printing through nozzle outlets 169-1 to 169-5.

According to an aspect of the present invention, printhead assembly 100 includes valve structures 190-1 and 190-2 that are adjustably disposed in nozzle channels 162-1 to 162-5, and system 50 also includes a valve control device 192 for controlling valve structures 190-1 and 190-2 to facilitate individual control over ink flow through each of nozzle channels 162-1 to 162-5. In particular, valve control device 192 controls valve structures 190-1 and 190-2 in a way that facilitates various operating states, where the flow of ink through each nozzle channel 162-1 to 162-5 is determined by the selected operating state. For example, in a first operating state shown in FIG. 1, valve structure 190-1 is positioned by valve control device 192 such that a portion 190-11 of valve structure 190-1 is disposed in nozzle channel 162-1 between inlet portion 162-1I and outlet portion 162-1O such that portion 190-11 blocks (prevents) the flow of material between inlet portion 162-1I and outlet portion 162-1O. As such, as described herein, nozzle channel 162-1 is closed in the first operating state. In a second operating state (not shown in FIG. 1, but described below), portion 190-11 is positioned away from the region between inlet portion 162-1I and outlet portion e.g., 162-1O of nozzle channel 162-1 such that a passage between inlet region 162-1I and outlet portion 162-1O is opened, and ink passes from reservoir 120 through nozzle outlet orifice 169-1 onto substrate 41 (e.g., such as is shown for nozzle channels 162-2 to 162-5 in FIG. 1). By disposing valve structure 190-1 inside printhead assembly 100 such that portion 190-11 is disposed adjacent to nozzle outlet orifice 169-1, the present invention facilitates a reduction in the occurrence of segmented gridlines associated with conventional printheads by reducing the distance between the high pressure material source (e.g., reservoir 120 and inlet region 162-1I) and substrate 41 at the start and end of each gridline printing process.

According to an aspect of the present invention, each valve structure 190-1 and 190-2 selectively controls the flow of material through two or more nozzle channels such that one or more nozzle channels controlled by a particular valve structure are selectively closed while, simultaneously, one or more other nozzle channels controlled by the particular valve structure are selectively opened. For example, according to the first operating state depicted in FIG. 1, valve structure 190-1 is selectively adjusted such that portion 190-11 is positioned between the inlet and outlet portions of nozzle channel 162-1 such that nozzle channel 162-1 is closed, and, simultaneously, a portion 190-12 of valve structure 190-1 is positioned away from the inlet and outlet portions of nozzle channel 162-2 such that nozzle channel 162-2 is opened. The adjusted position of valve structure 190-1 therefore controls the flow of material through nozzle channels 162-1 and 162-2 such that ink is printed from nozzle outlet 169-2 but not from nozzle outlet 169-1. In the second operating state (described above, but not shown in FIG. 1), valve structure 190-1 is adjusted such that portion 190-11 is moved out of the region between inlet portion 162-1I and outlet portion 162-1O of nozzle channel 162-1 such that both nozzle channels 162-1 and 162-2 are opened. Note that, in the second operating state, nozzle channel 162-2 may either be opened (e.g., portion 190-12 is positioned away from the inlet and outlet portions of nozzle channel 162-2, as shown in FIG. 1), or closed (i.e., portion 190-12 is positioned between inlet and outlet portions of nozzle channel 162-2). As described in additional detail below, by selectively controlling two or more nozzle channels to independently open/close in accordance with a desired operating state, the present invention facilitates printing gridlines on non-rectangular substrates without violating edge spacing requirements. In addition, selectively controlling two or more nozzle channels to independently open/close facilitates automatically correcting misalignment of the solar panel substrate 41 in the cross-process direction. For example, as indicated in FIG. 1, when substrate 41 is improperly positioned below printhead assembly 100 such that side edge 41S is located below nozzle channel 162-2 but not below nozzle channel 162-1 (i.e., substrate 41 is erroneously shifted to the right relative to printhead assembly 100), then the operating state of printhead assembly 100 is selected such that nozzle channel 162-1 remains closed during the printing process, thereby preventing the waste and mess associated with misprinted ink. At the same time, over the opposite side edge of substrate 41 (not shown), one or more nozzle channels are selectively opened to account for out-of-position substrate 41, thereby avoiding the time and cost required to reposition substrate 41 under a printhead that does not include the features of the present invention.

According to another aspect of the present invention, valve structures 190-1 and 190-2 are independently controlled by valve control device 192 such that valve structure 190-1 selectively controls material flow from nozzle channels 162-1 and 162-2, and valve structure 190-2 selectively controls ink flow from nozzle channels 162-3, 162-4 and 162-5. As illustrated in FIG. 1, this independent control further facilitates printing on non-rectangular substrates by allowing selected nozzle channels (e.g., nozzle channels 162-3, 162-4 and 162-5) to be simultaneously turned on while other nozzle channels (e.g., nozzle channels 162-1 and 162-2) remain turned off. In particular, when printhead assembly 100 is positioned relative to substrate 41 such nozzle outlets 169-3 to 169-5 are disposed a predetermined distance S from front edge 41F of substrate 41, valve structure 190-2 is controlled by valve control device 192 to open nozzle channels 162-3, 162-4 and 162-5, thereby producing traces 44-3, 44-4 and 44-5 having front edges 44-3F, 44-4F and 44-5F that are respectively spaced a predetermined distance S from front edge 41F. Note that opening nozzle channel 162-2 at the same time as nozzle channels 162-3, 162-4 and 162-5 would produce a trace that violates the edge spacing requirement (i.e., distance S). At a time subsequent to that associated with opening nozzle channels 162-3, 162-4 and 162-5, i.e., when printhead assembly 100 is positioned such that nozzle outlet 169-2 is properly positioned over substrate 41, valve structure 190-1 is controlled by valve control device 192 to open nozzle channel 162-2, thereby producing trace 44-2 having front edge 44-2F spaced at distance S from chamfered edge 41C. Thus, by controlling valve structure 190-1 separately from valve structure 190-2, the present invention facilitates the printing of gridlines 44-1 to 44-5 on non-rectangular substrate 41 without violating the predetermined edge spacing requirements.

Figure 2:
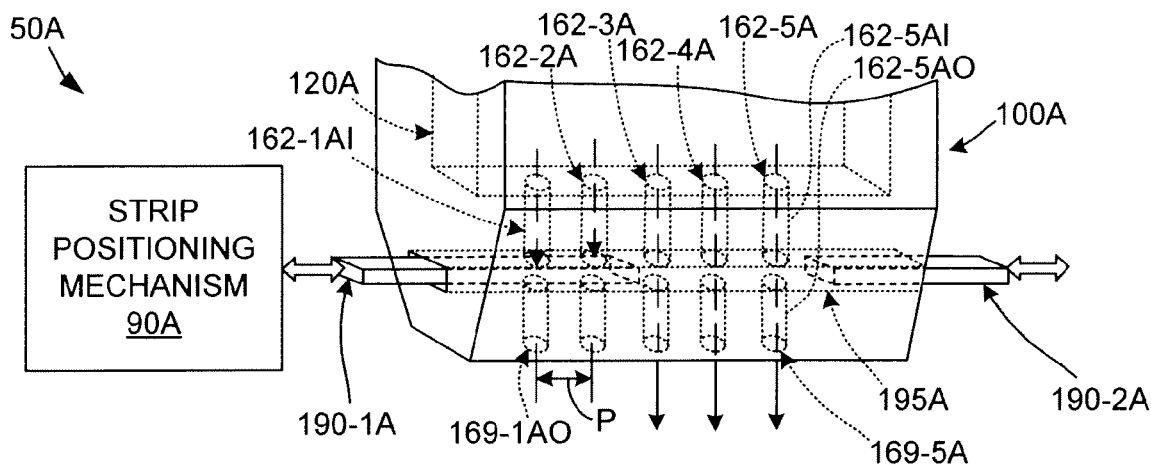
FIG. 2 is a simplified perspective view showing a printhead assembly of the micro-extrusion system of FIG. 1 according to a first embodiment of the present invention.

FIG. 2 is a modified partial perspective view showing a portion of a micro-extrusion system 50A for printing inks onto a solar panel substrate (not shown) according to a first specific embodiment of the present invention. Micro-extrusion system 50A generally includes a printhead assembly 100A having reservoir 120A and nozzle channels 162-1A to 162-5A defined in a manner similar to that described above, where nozzle channels 162-1A to 162-5A are spaced at a pitch P of 3 mm or less. In accordance with the present embodiment, printhead assembly 100A defines a slot (elongated opening) 195A that extends the length of the head, and is adjacent and parallel to the lower face defining the nozzle outlets (e.g., nozzle outlets 169-1A and 169-5A). In particular, slot 195A extends between the inlet and outlet portions of each of nozzle channels 162-1A to 162-5A. For example, a first region of slot 195A is located between inlet portion 162-1AI and outlet portion 162-1AO of nozzle channel 162-1A, and a second region of slot 195A is located between inlet portion 162-5AI and outlet portion 162-5AO of nozzle channel 162-5A. Tightly fitting, solid rectangular strips (elongated members) 190-1A and 190-2A serve as valve structures, and are slidably (movably) disposed in slot 195A such that each strip 190-1A and 190-2A and can be positioned (slid) along slot 195A (e.g., moved further into printhead assembly 100A, or fully or partially removed from printhead assembly 100A).

FIG. 2 serves as a simplified illustration showing how strips 190-1A and 190-2A can be selectively positioned by a strip positioning mechanism 90A to open/close selected nozzle channels 162-1A to 162-5A. As depicted by the dashed lined arrows, strip 190-1A is positioned in the portion of slot 195A coinciding with nozzle channels 162-1A and 162-2A such that strip 190-1A blocks the flow of ink through nozzle channels 162-1A and 162-2A, and strip 190-2A is positioned in the portion of slot 195A coinciding with nozzle channels 162-3A, 162-4A and 162-5A such that ink flows through nozzle channels 162-3A, 162-4A and 162-5A. The flow of ink through nozzle channels 162-1A to 162-5A can subsequently be adjusted by selectively inserting/retracting one or more of strips 190-1A and 190-2A. For example, movement of strip 190-1A to the left by a small amount would open nozzle channel 162-2A, and further movement to the left would also open nozzle channel 162-1A. Similarly, insertion of strip 190-2A to the left would close one or more of nozzle channels 162-3A, 162-4A and 162-5A, depending on the distance that strip 190-2A is inserted. Obviously the mechanism pumping the ink may need adjustment to reduce the rate of ink flow into printhead assembly 100A to keep the rate of flow per active (open) nozzle at a constant rate. The exact width and vertical placement of the slots/strips effects the kind of control provided. Many variations upon this design and method of use exist, each having different features and problems.

FIGS. 3(A) to 3(F) are top plan views illustrating printhead 100A (described above with reference to FIG. 2) during a gridline printing process performed on non-rectangular substrate 41. As described above, the gridline printing process involves forming parallel gridlines on substrate such that the gridlines meet all predetermined edge spacing requirements.

Figure 3A:
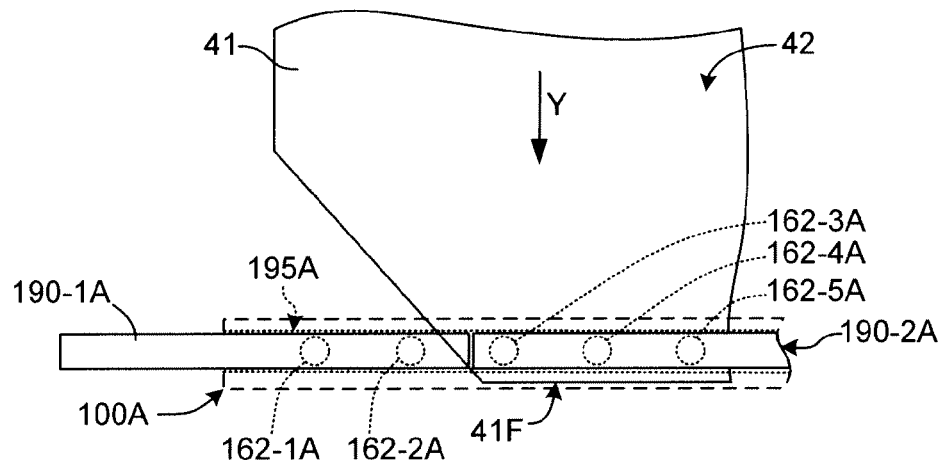
FIGS. 3(A), 3(B), 3(C), 3(D), 3(E), and 3(F) are simplified top views showing a portion of the micro-extrusion system of FIG. 2 during a gridline printing operation.

Referring to FIG. 3(A), the gridline printing process begins with strips 190-1A and 190-2A fully inserted into slot 195A such that all nozzle channels 162-1A to 162-5A are closed, thereby preventing the deposition of ink. Printhead 100A is positioned over substrate 41 such that nozzle channels 162-1A to 162-5A are aligned parallel to front edge 41F. Substrate 41 is moved relative to printhead 100A in the direction indicated by arrow Y in FIG. 3(A), whereby nozzle channels 162-1A to 162-5A are caused to pass over upper surface 42.

Figure 3B:
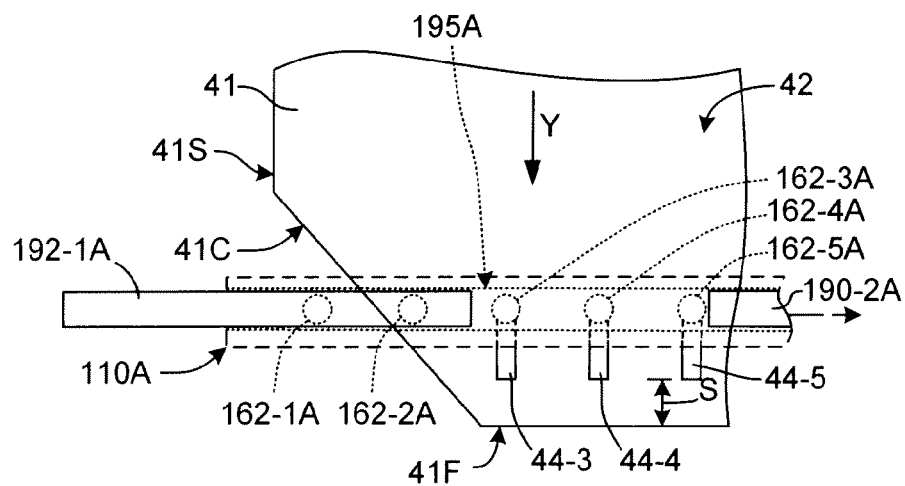

As depicted in FIG. 3(B), when substrate 41 (or printhead assembly 100A) has moved such that nozzle channels 162-3A to 162-5A are disposed a predetermined edge spacing distance S from front edge 41F, strip 190-2A is moved in slot 195A such that nozzle channels 162-3A to 162-5A are opened, whereby ink is deposited on upper surface 42 to form gridlines 44-3, 44-4 and 44-5, respectively. Note that front edges of these gridlines are spaced at distance S from front edge 41F. Note also that, because nozzle channels 162-1A and 162-2A are positioned over chamfered edge 41C of substrate 41, strip 190-1A remains in its initial location inside slot 195A, thereby preventing the deposition of ink from nozzle channels 162-1A and 162-2A that would violate the established edge constraints.

Figure 3C:
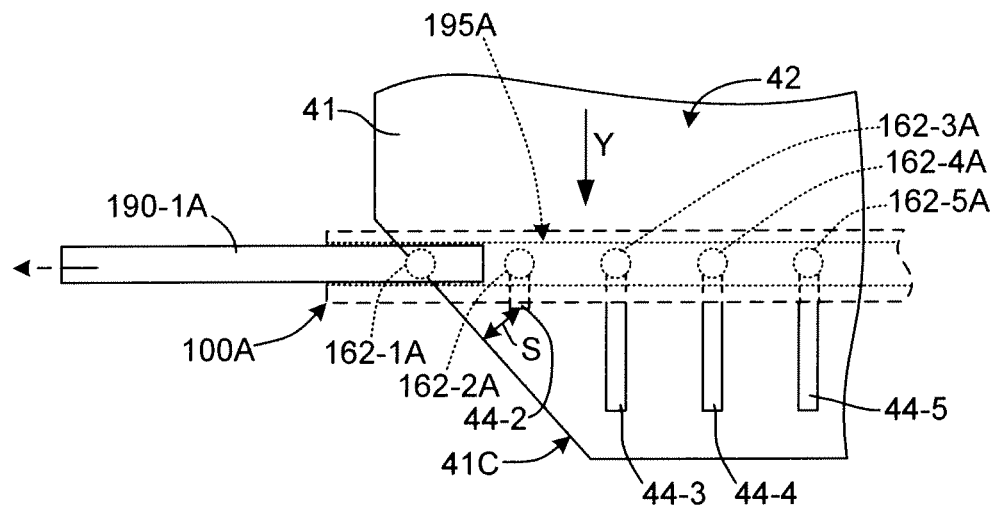

As depicted in FIG. 3(C), with nozzle channels 162-3A to 162-5A remaining open to form gridlines 44-3 to 44-5, when nozzle channel 162-2A is disposed distance S from chamfered edge 41C, strip 190-1A is moved slightly in slot 195A such that nozzle channel 162-2A is opened, whereby ink is deposited on upper surface 42 to form gridline 44-2. Note that nozzle channel 162-1A remains positioned over chamfered edge 41C, so strip 190-1A remains located inside slot 195A such that ink is prevented from being extruded from nozzle channel 162-1A.

Figure 3D:
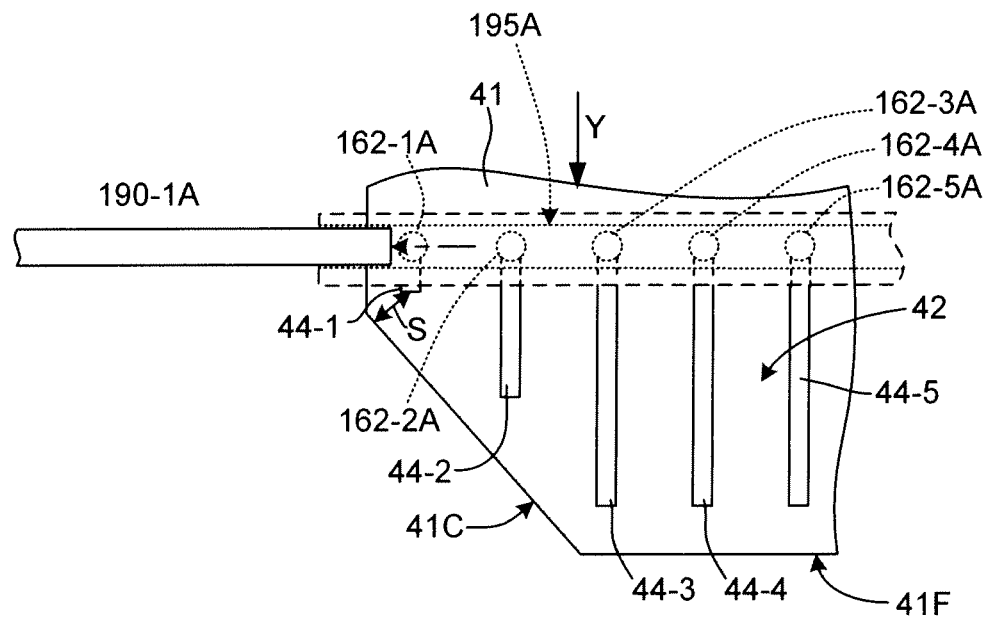

FIG. 3(D) shows the printing process when nozzle channel 162-1A is disposed distance S from chamfered edge 41C, and strip 190-1A is moved in slot 195A such that nozzle channel 162-1A is opened, whereby ink is deposited on upper surface 42 to form gridline 44-1. Nozzle channels 162-2A to 162-5A remaining open to continue forming gridlines 44-2 to 44-5.

Figure 3E:
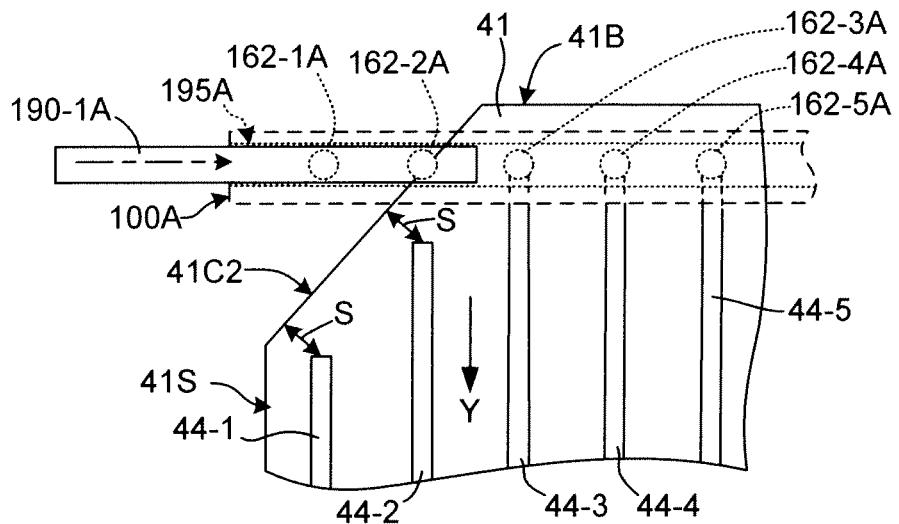
Figure 3F:
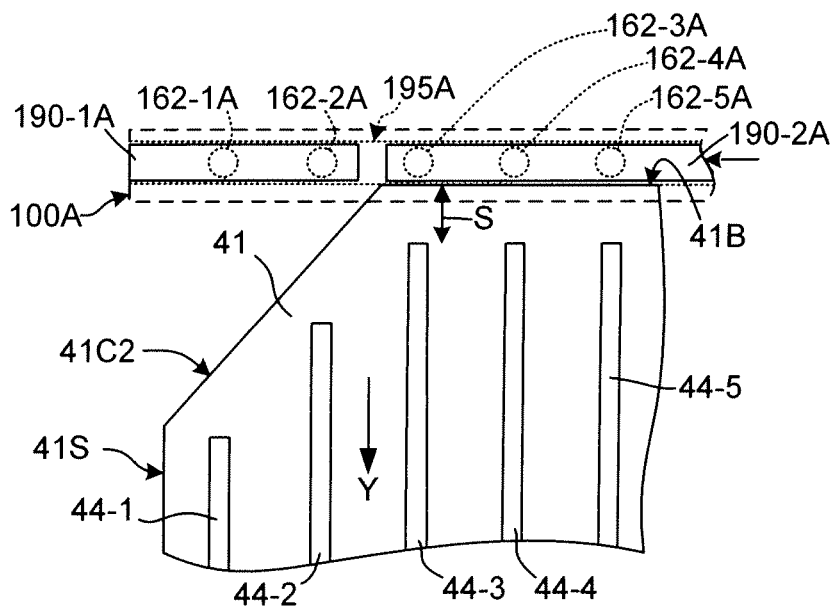

FIGS. 3(E) and 3(F) depict the ending phases of the gridline printing process (i.e., when printhead assembly 100A passes over a rearward chamfered edge 41C2 that extends between side edge 41S and back edge 41B of substrate 41). Referring to FIG. 3(E), in a manner opposite to that describe above, valve structure 190-1A is inserted in stages into slot 195A to close nozzle channels 162-1A and 162-2A such that rear endpoints of gridlines 44-1 and 44-2 are located at the predetermined distance S from rearward chamfered edge 41C2. Then, as shown in FIG. 3(F), valve structure 190-2A is inserted into slot 195A to close nozzle channels 162-3A, 162-4A and 162-5A such that rear endpoints of gridlines 44-3, 44-4 and 44-5 are located at the predetermined distance S from back edge 41B of substrate 41.

Figure 11:
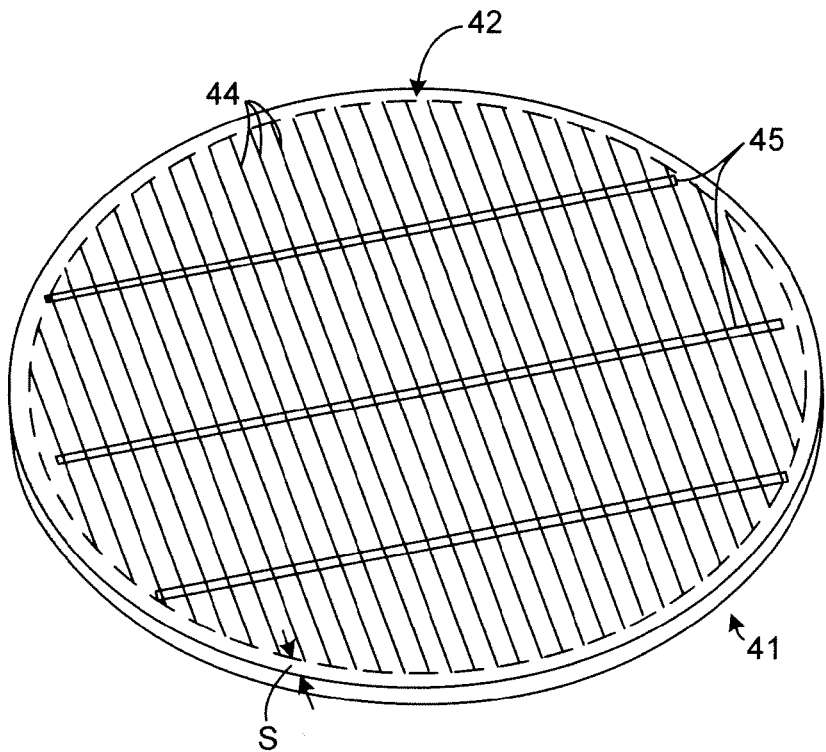
FIG. 11 is a top plan view showing a conventional H-pattern solar cell formed on a circular substrate.
Figure 12:
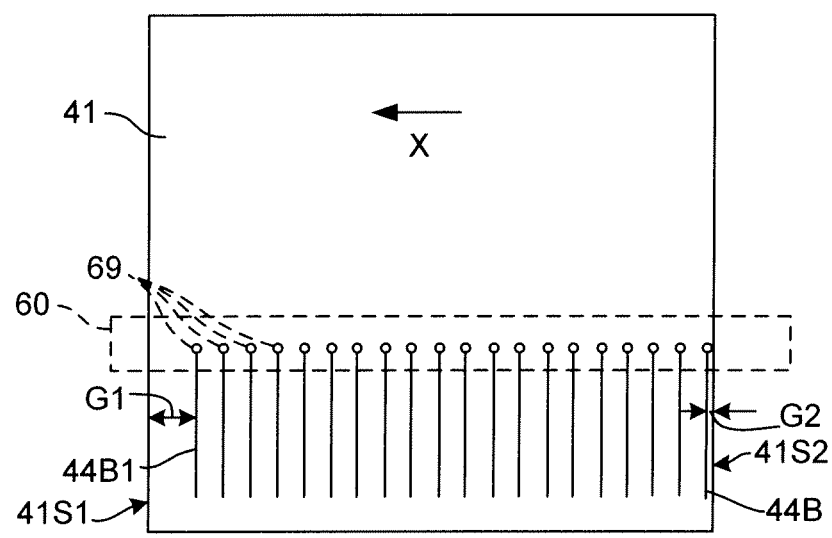
FIG. 12 is a simplified top view depicting a conventional gridline printing process.

FIGS. 3(A) to 3(F) illustrate that the nozzle channels of a printhead assembly can be opened/closed in order, from ones side to the other side of the printhead (e.g., if one strip is used), or from an innermost nozzle channel to an outermost nozzle channel (if two strips are used, as illustrated in FIGS. 3(A) to 3(F)). For a shape like the circular cell depicted in FIG. 11, the process is similar. For example, two equal-length strips are placed in the slot, one from each end. Initially they are both fully inserted and remain that way until the lip of the cell has passed under the printhead. By gradually removing both strips symmetrically (but non-linearly), the extruded lines will create a semi-circle. Once the center of the cell passes the head, this process can be reversed to create the other half of the circular print. For a clean start/stop to an individual trace, the strip should be moved rapidly from its end being just before the nozzle (normal ink flow), to its end being just after the nozzle (no flow). However a more gradual motion would allow the start and end of the trace to be somewhat shaped. When used in conjunction with co-extrusion processing (described below), this method could interrupt the flow of support material to the traces for the narrow region when printing the traces under where the buss-bars will eventually be laid.

In many cell configurations, the ends of traces typically carry much less current than the central portions. By gradually throttling the ink flow rate at the end of a trace (especially if the support material is not so limited), then the trace can be tapered (i.e., made narrower at its ends). In these low current regions, the slightly increase in the cell's efficiency through reducing the shadowing overcomes the slight efficiency reduction due to the corresponding increases in current losses. If such shaping was used, and the cell geometry was such that the tapering of the traces could usefully extend for a longer distance than the distance between shut-off of two adjacent nozzles, then a calibrated V-notch could be cut into the strip's end. This would allow active control of two or more nozzles after the nozzle currently being turned-on or shut-off. Other shaped notches (e.g. semi-circular or parabolic) may be appropriate in some instances.

Figure 4A:
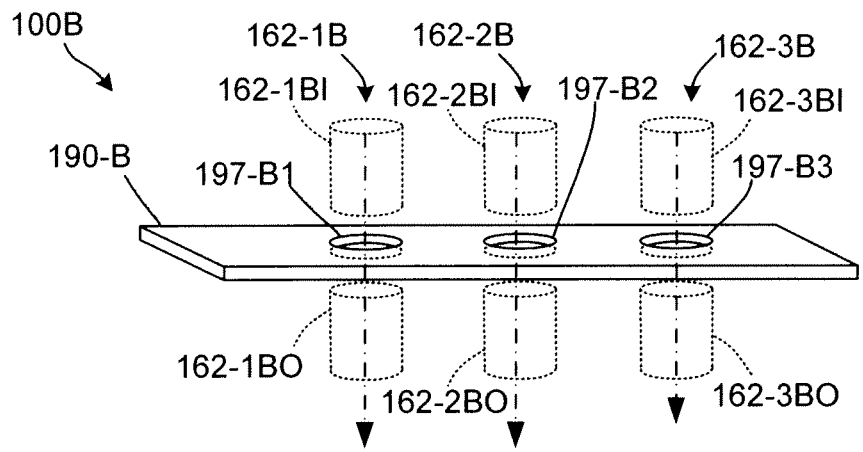
FIGS. 4(A) and 4(B) are simplified perspective views showing a valve structure in accordance with a specific embodiment of the present invention.
Figure 4B:
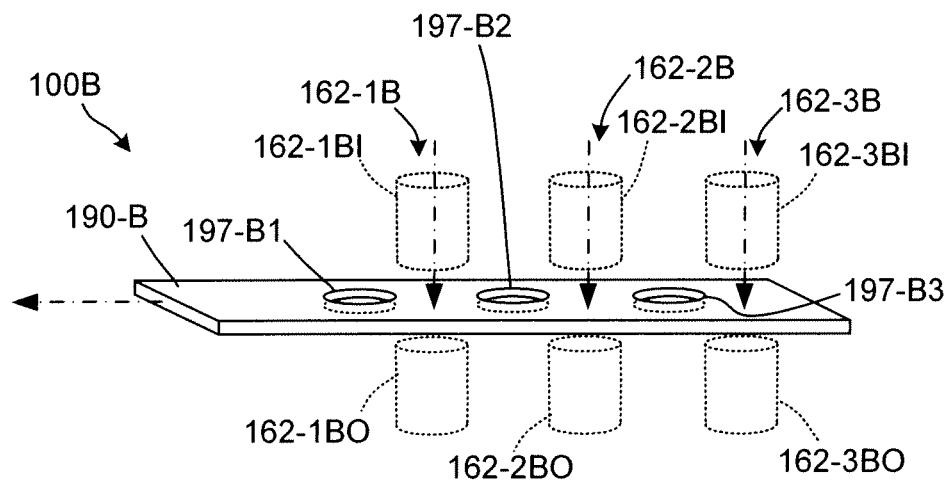

FIGS. 4(A) and 4(B) are simplified perspective views showing a valve structure 190B that is slidably disposed inside a printhead 100B in accordance with another embodiment of the present invention. Printhead 100B that includes nozzle channels 162-1B to 162-3B and a rectangular slot (not shown) that passes between inlet portions 162-1BI, 162-2BI, and 162-3BI, and outlet portions 162-1BO, 162-2BO, and 162-3B), with portions of printhead 100B surrounding nozzle channels 162-1B to 162-3B being omitted for clarity. Valve structure 190B differs from the embodiment described above with reference to FIG. 2 in that, where valve structures 190-1A and 190-2A are solid strips, valve structure 190B defines openings 197-B1 to 197-B3 that are disposed to align with nozzle channels 162-1B to 162-3B when valve structure 190B is slid into an open position (shown in FIG. 4(A)). As indicated in FIG. 4(B), when valve structure 190B is slid into a closed position, openings 197-B1 to 197-B3 are offset from nozzle channels 162-1B to 162-3B, respectively, and nozzle channels 162-1B to 162-3B are blocked by solid portions of valve structure 190B. Printhead 100B is used, for example, for square solar cell substrates, where rapidly withdrawing or inserting a solid strip-like valve structure produce an unacceptably staggered pattern to the gridlines. Printhead 100B avoids this staggering by simultaneously opening/closing all of the nozzle channels with a relatively small movement of strip 190B. This implementation may be better for printhead cleaning in that, when solid strips are used, large sections of the slot may sometimes be filled with ink, and even frequent movements of the strip may give rise to small volumes of ink that are not routinely part of the overall flow. If these ink volumes were to dry in place and then later be dislodged, then it may cause clogging of the nozzle or later portions of the passage. In the case of the strip with holes the size of (or smaller than) the entrance/exit passage, then only a small "coin" of ink is removed from the flow, and upon the hole being again lined up with the flow, all of this ink is once again returned to the flow.

Those skilled in the art will recognize that many variations on the concept shown in FIGS. 4(A) and 4(B) are possible. For example, by using one or more elongated holes in the strip, a predetermined series of nozzle channels may be opened based on the sliding position of the valve structure. In addition, combinations of holes, elongated holes, the progressively blocking nozzles and notches in the strip ends can all be used to achieve different line shapes and different overall printed patterns.

Figure 5:
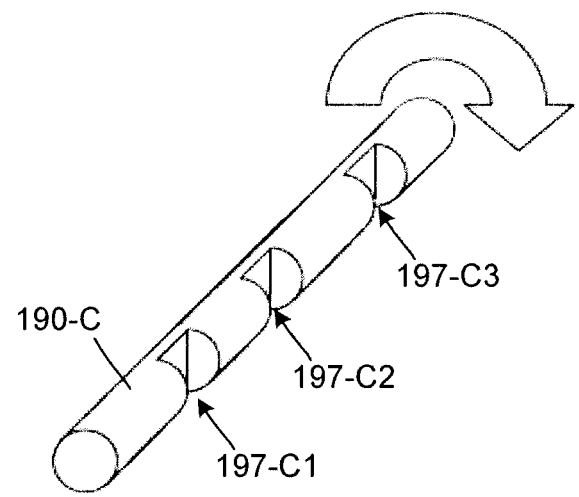
FIG. 5 is a simplified diagram showing a rod-type valve structure according to another specific embodiment of the present invention.

FIG. 5 depicts another significant variation in which a rod-like valve structure 190C is used that is movably disposed in a cylindrical hole or bore defined in a printhead (not shown). The accurate machining of the cylindrical hole should be a lot simpler than forming a rectangular slot. The rod-like valve structure could be a solid rod, and operate similar to the solid strip embodiment described above with reference to FIG. 2 by blocking off nozzles from the outside first as it is moved in and out. Alternatively, the rod-like valve structure could be processed to define holes that serve in a manner similar to that described above with reference to FIGS. 4(A) and 4(B) to open/close several nozzle channels simultaneously as valve structure 190C moves in and out of a printhead. Alternatively, the round aspect could be used to facilitate opening/closing the nozzle channels by cutting notches 197-C1, 197-C2 and 197-C3 into the side of the rod-like structure having a spacing corresponding to that of the nozzle channels. With this arrangement, opening/closing the nozzle channels is achieved by rotating valve structure 190C (e.g., as indicated by the double-line arrow in FIG. 5) such that the notches either allow passage of ink, or are rotated away so the rod material blocks the passage of ink.

As suggested above with reference to FIG. 1, the specific embodiments described above could also be used to automatically correct misalignment between the printhead and substrate in the cross-process direction. With the printing processes described above, the placement of the cell with respect to the head in the cross-process direction is critical. A displacement of on a couple of millimeters will cause the printed margins to be violated: too large an unprinted surface on one side (reducing efficiency), and danger of printing over a substrate edge on the other (destroying the cell). Once placed, moving the cell substrate laterally may be difficult and/or expensive. Likewise moving the entire head from side to side is likely undesirable. However by using two strips, one in each end of the slot, and moving them in concert, the printed region can be moved in the cross-process direction. The head would be made somewhat wider than the actual wafer and 2-3 nozzles at each end routinely blocked by the strip. Once the cell is sensed to be offset, the strip at one end can be used to open a nozzle, and the strip at the other end used to close a nozzle. This moves the printed region across by the width of one line-gap.

Figure 6:
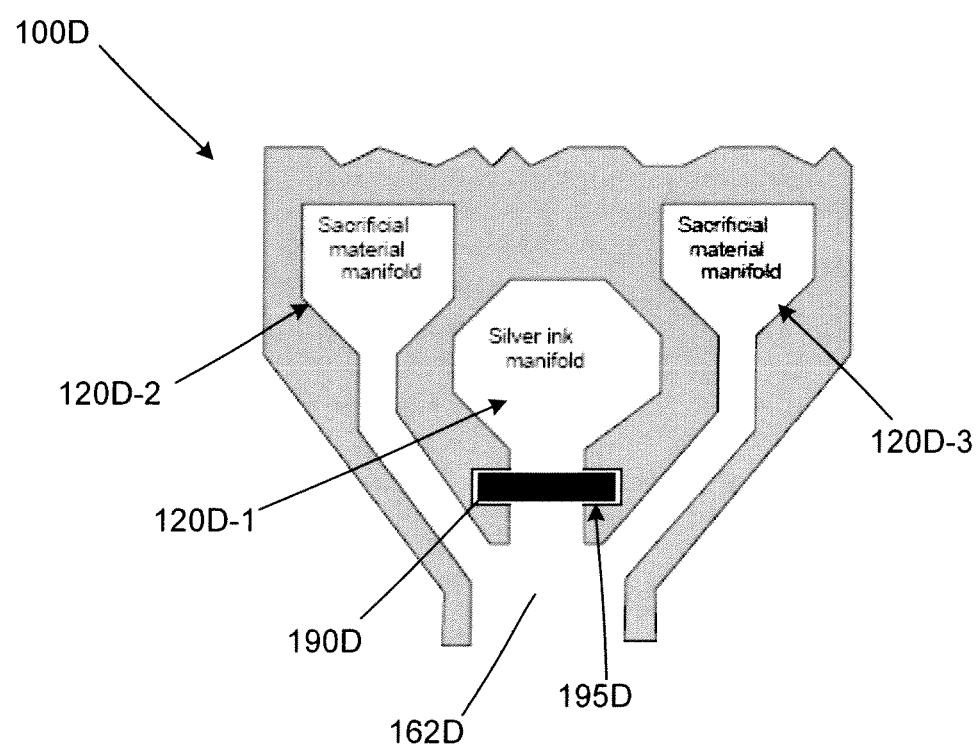
FIG. 6 is a cross-sectional end view of a co-extrusion printhead including a valve structure according to another specific embodiment of the present invention.
Figure 7:
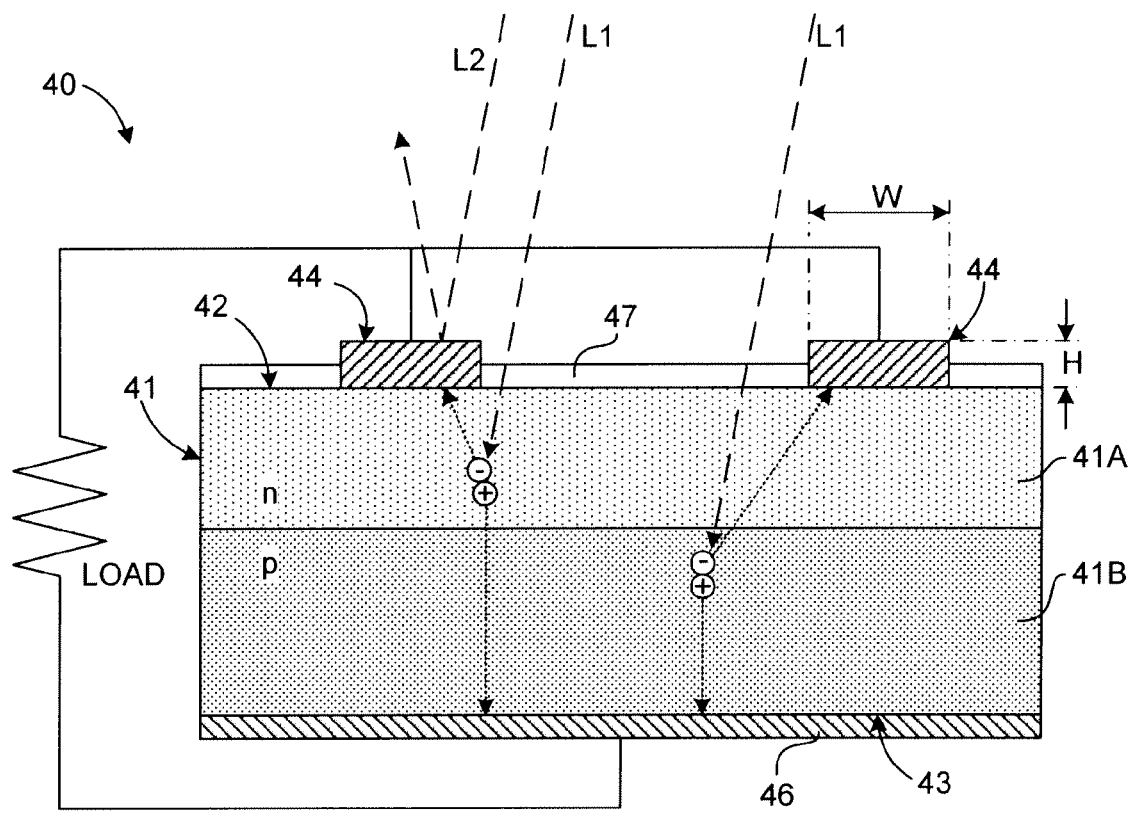
FIG. 7 is a simplified cross-sectional side view showing a conventional solar cell.
Figure 8A:
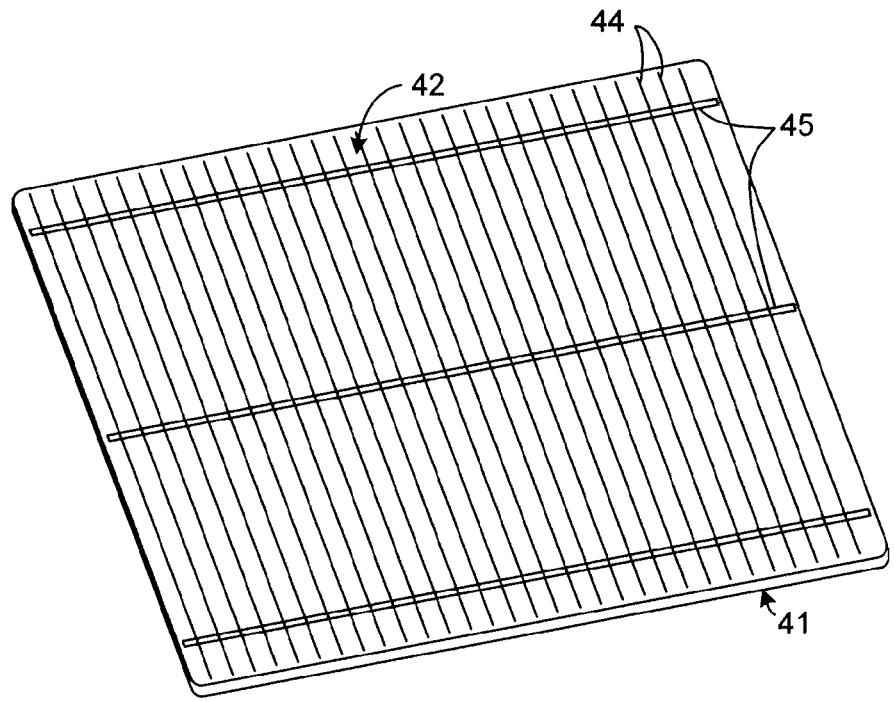
FIGS. 8(A) and 8(B) are top and bottom perspective views, respectively, showing a conventional H-pattern solar cell.
Figure 8B:
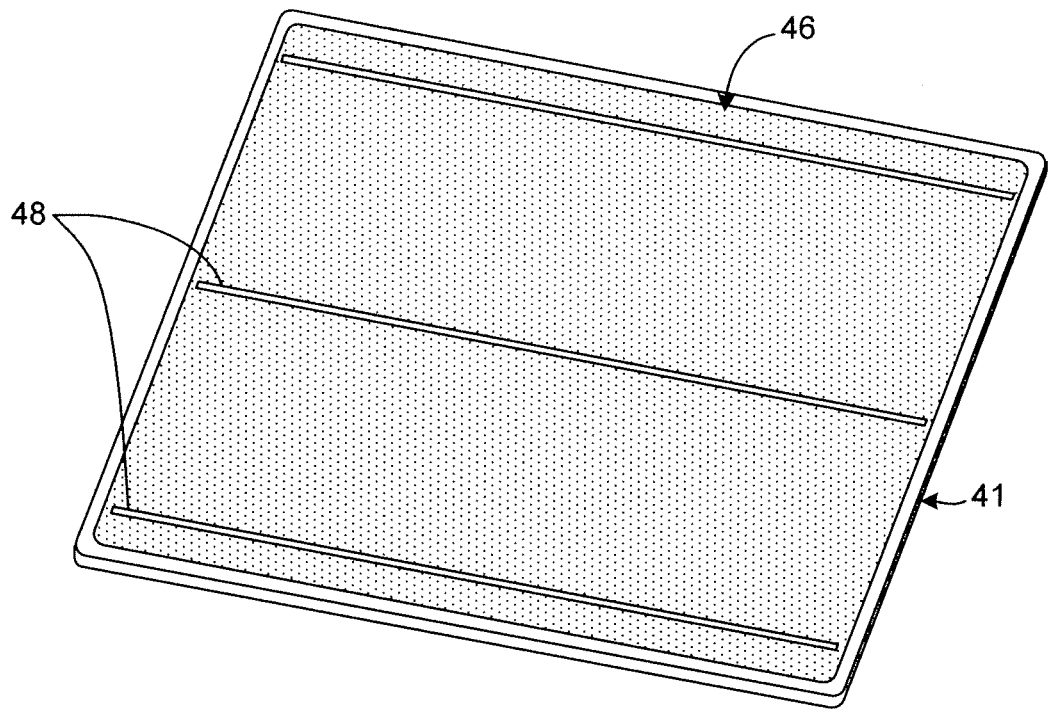
Figure 9:
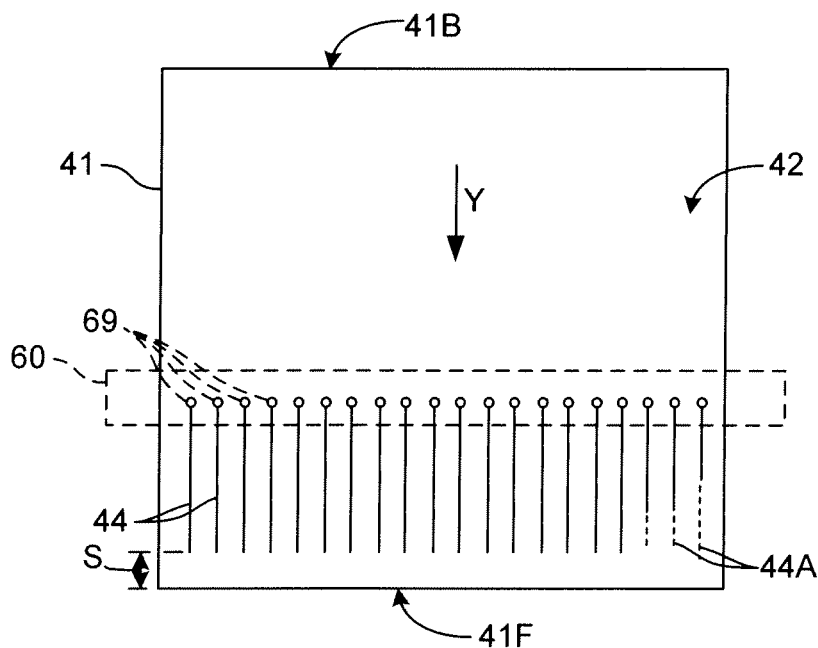
FIG. 9 is a simplified top view depicting a conventional gridline printing process.

FIG. 6 is a simplified cross-sectional side view showing a portion of a co-extrusion printhead 100D for simultaneously depositing two materials (e.g., a sacrificial, electrically non-conducting material and a conductive (e.g., Silver) ink) onto a solar cell substrate. Co-extrusion of such materials is generally known in the art, and a printhead suitable for modification in the manner described herein is set forth in additional detail in co-owned and co-pending U.S. patent application Ser. No. 12/267,069 (cited above). In the present embodiment, printhead 100D includes a strip-like valve structure 190D that is slidably disposed in a slot 195D (both shown in end view) such that it selectively blocks a portion of nozzle channel 162D. Silver ink (conductive gridline material) and (non-conductive) sacrificial material are pumped into printhead 100D through corresponding inlet ports and are supplied by way of separate manifolds 120D-1, 120D-2 and 120D-3 to the outlet portion of nozzle channel 162D, where the silver ink flow is merged with the sacrificial material flow before being simultaneously extruded through the associated nozzle outlet orifice. Note that only silver ink flowing from a silver ink manifold 120D-1 is interrupted by the presence of strip 190D. Because it is non-conductive, it is acceptable for sacrificial material of the silver is controlled, for example, using the methods to cross the cell boundary (i.e. to be deposited outside of the edge constraints), so the flow of material from sacrificial material manifolds 120D-2 and 120D-3 is not controlled by strip 190D. During operation, only the flow described above (i.e., when the valve control device moves the valve structure into the closed (first) operating position, a portion of valve structure is positioned in the passage between (first) manifold 120D-1 and the outlet portion of nozzle channel such that the conductive gridline material is prevented from passing through the outlet orifice and only the nonconductive sacrificial material passes through the outlet orifice, and when the valve in the open (second) operating position, valve structure 190D is positioned away from the passage between manifold 120D-1 and the outlet portion of nozzle channel 162D such that the conductive gridline material and the nonconductive sacrificial material are simultaneously co-extruded through the nozzle outlet orifice of nozzle channel 162D). However if desired, a wider strip in the same location will control both the silver ink and the sacrificial material in a coordinated fashion (both are turned on or off simultaneously). If the strip was positioned lower, after the merge point of the three streams, then the combined stream would be turned on/off.

Although the present invention has been described with respect to certain specific embodiments, it will be clear to those skilled in the art that the inventive features of the present invention are applicable to other embodiments as well, all of which are intended to fall within the scope of the present invention. For example, the valving control described herein may be separate from the printhead assembly (i.e., attached to or beneath the printhead). In addition, the valve structures described herein may be set higher in the printhead assembly such that the flow of ink to multiple nozzle channels at once is controlled by the position of the valve structure.

The invention claimed is:

1. A micro-extrusion system comprising:
    a printhead assembly including:
        at least one inlet port, and
        a nozzle structure defining a plurality of elongated nozzle channels including a first nozzle channel, each elongated nozzle channel having at least one inlet portion communicating with said at least one inlet port, and an outlet portion communicating with an associated nozzle outlet orifice;
    a valve structure movably disposed adjacent to the associated nozzle outlet orifice of each of said plurality of elongated nozzle channels;
    a material feed system for pumping a conductive gridline material and a non-conductive sacrificial material into said printhead assembly through said at least one inlet port such that said materials are supplied at a predetermined pressure into said inlet portion of each of said plurality of elongated nozzle channel; and
    a valve control device for controlling said valve structure between first and second operating states,
    wherein the printhead assembly is arranged such that, when the valve control device positions the valve structure in the first operating state, a first portion of said valve structure is positioned such that at least one of said conductive gridline and non-conductive sacrificial materials are prevented by said first portion from passing from the outlet orifice of said first nozzle channel onto said substrate, and when the valve control device positions the valve structure in the second operating state, said first portion of said valve structure is positioned such that both of said conductive gridline and non-conductive sacrificial materials flow through said associated nozzle outlet orifice of said first nozzle channel and are simultaneously co-extruded onto said substrate.

2. The micro-extrusion system according to claim 1, wherein said valve control device for controlling said valve structure further comprises means for simultaneously controlling said first portion of said first valve structure and a second portion of said first valve structure such that during the first operating state the second portion of said first valve structure is positioned to pass said at least one of said conductive gridline and non-conductive sacrificial materials through said associated nozzle outlet orifice onto said substrate.

3. The micro-extrusion system according to claim 1, wherein said valve control device for controlling said valve structure further comprises means for independently simultaneously controlling said valve structure and a second valve structure, said first valve structure being disposed to selectively control flow of said at least one of said conductive gridline and non-conductive sacrificial materials from a first group of said plurality of nozzle channels, and said second valve structure being disposed to selectively control flow of said at least one of said conductive gridline and non-conductive sacrificial materials from a second group of said plurality of nozzle channels.

4. The micro-extrusion system according to claim 1,
    wherein said valve structure is disposed between the inlet portion and the outlet portion of each of said plurality of elongated nozzle channels, and
    wherein said valve control device for controlling said valve structure includes means for moving said valve structure between first and second operating positions such that, in the first operating position, a first portion of said valve structure is positioned between the inlet portion and the outlet portion of the first nozzle channel such that said at least one of said conductive gridline and non-conductive sacrificial materials are prevented by said first portion from passing through the associated nozzle outlet orifice of said first nozzle channel, and in the second operating position, said first portion of said valve structure is positioned away from the inlet portion and the outlet portion of the first nozzle channel such that said at least one of said conductive gridline and non-conductive sacrificial materials pass from said inlet portion into said outlet portion and through said associated nozzle outlet orifice of said first nozzle channel.

5. The micro-extrusion system according to claim 4,
wherein said nozzle structure defines an elongated opening extending between the inlet portion and the outlet portion of each of said plurality of elongated nozzle channels,
wherein said valve structure comprises an elongated member movably disposed in said elongated opening, and
wherein said valve control device for controlling said valve structure comprises a positioning mechanism for positioning said elongated member in said elongated opening.

6. The micro-extrusion system according to claim 5, wherein said elongated opening comprises a rectangular slot, and wherein said elongated member comprises a strip that is slidably disposed in said elongated slot, said strip having a rectangular cross-section.

7. The micro-extrusion system according to claim 6, wherein rectangular strip comprises a solid member.

8. The micro-extrusion system according to claim 6, wherein rectangular strip comprises a plurality of openings.

9. The micro-extrusion system according to claim 6, further comprising means for moving said rectangular strip between the first operating state, in which solid portions of said rectangular strip are positioned between said inlet portion and said outlet portion of each of said plurality of nozzle channels, and the second operating state, in which the plurality of openings are aligned with said plurality of nozzle channels such that said material passes from the inlet portion of each of the plurality of nozzle channels into associated outlet portions of said plurality of nozzle channels.

10. The micro-extrusion system according to claim 5, wherein said elongated opening comprises an elongated bore having a circular cross-section, and wherein said elongated member comprises a rod that is slidably disposed in said elongated bore.

11. The micro-extrusion system according to claim 10, wherein said rod defines a plurality of openings.

12. The micro-extrusion system according to claim 11, wherein said positioning mechanism comprises means for sliding said rod in said elongated bore.

13. The micro-extrusion system according to claim 11, wherein said positioning mechanism comprises means for rotating said rod in said elongated bore.

14. The micro-extrusion system according to claim 1,
wherein said valve structure is disposed between a first manifold containing said conductive gridline material and said outlet portion of each of said plurality of elongated nozzle channels,
wherein said printhead assembly is constructed such that said non-conductive sacrificial material flows from a second manifold into said outlet portion of each of said plurality of elongated channels, and
wherein said valve control device for controlling said valve structure includes means for moving said valve structure between first and second operating positions such that, in the first operating position, a first portion of said valve structure is positioned in a passage between the first manifold and the outlet portion of the first nozzle channel such that said conductive gridline material is prevented by said first portion from passing through the associated nozzle outlet orifice of said first nozzle channel, whereby only said nonconductive sacrificial material passes through said associated nozzle outlet orifice, and in the second operating position, said first portion of said valve structure is positioned away from the passage such that both said conductive gridline material and said nonconductive sacrificial material are simultaneously co-extruded through said associated nozzle outlet orifice of said first nozzle channel.

* * * * *